(12) United States Patent
Darzy

(10) Patent No.: US 8,593,320 B2
(45) Date of Patent: Nov. 26, 2013

(54) ANALOG CONVERSION OF PULSE WIDTH MODULATED SIGNALS

(75) Inventor: Saul Darzy, Edgware (GB)

(73) Assignee: STMicroelectronics (Research & Development) Limited, Marlow, Buckinghamshire (GB)

( * ) Notice: Subject to any disclaimer, the term of this patent is extended or adjusted under 35 U.S.C. 154(b) by 31 days.

(21) Appl. No.: 13/264,686

(22) PCT Filed: Apr. 9, 2010

(86) PCT No.: PCT/EP2010/054705
§ 371 (c)(1),
(2), (4) Date: Feb. 14, 2012

(87) PCT Pub. No.: WO2010/118990
PCT Pub. Date: Oct. 21, 2010

(65) Prior Publication Data
US 2012/0133417 A1    May 31, 2012

(30) Foreign Application Priority Data

Apr. 16, 2009  (GB) .................................. 0906590.5

(51) Int. Cl.
*H03M 1/66* (2006.01)
(52) U.S. Cl.
USPC .......................................... 341/150; 341/144
(58) Field of Classification Search
USPC .............. 341/150, 144, 152; 330/10; 332/109
See application file for complete search history.

(56) References Cited

U.S. PATENT DOCUMENTS

| | | | |
|---|---|---|---|
| 4,107,671 A | 8/1978 | Huntington et al. | |
| 5,148,170 A | 9/1992 | Leopold et al. | |
| 7,408,392 B2 * | 8/2008 | Ivanov | 327/172 |
| 7,903,015 B1 * | 3/2011 | Hezar et al. | 341/152 |
| 7,944,193 B2 * | 5/2011 | Wu et al. | 323/283 |
| 8,299,946 B2 * | 10/2012 | Soenen et al. | 341/143 |
| 2001/0006371 A1 | 7/2001 | Bolz | |
| 2007/0076792 A1 | 4/2007 | Ivanov | |

OTHER PUBLICATIONS

International Search Report and Written Opinion for PCT/EP2010/054705 mailed Sep. 1, 2010 (14 pages).
UK-IPO Search Report for GB 0906590.5 mailed Aug. 20, 2010 (3 pages).

* cited by examiner

*Primary Examiner* — Brian Young
(74) *Attorney, Agent, or Firm* — Gardere Wynne Sewell LLP

(57) ABSTRACT

A method of converting a periodic pulse width modulated input signal into a voltage output signal wherein the input signal is in an active state for a first portion of each of successive time periods and in an inactive state for a second portion of each time period. A first and second input is supplied to an integrator circuit and a first capacitor is coupled between a first output of the integrator circuit and the first input and a second capacitor is coupled between a second output and the second input of the integrator circuit during a first time period of the pulse width modulated signal. A third capacitor is coupled between a first output of the integrator circuit and the first input and a fourth capacitor is coupled between a second output of the integrator circuit and the second input during a successive second time period of the pulse width modulated signal. Said coupled capacitors are charged during the active state of the first and second time periods and discharged during the inactive state of the first and second time periods.

21 Claims, 6 Drawing Sheets

US 8,593,320 B2

ANALOG CONVERSION OF PULSE WIDTH MODULATED SIGNALS

PRIORITY CLAIM

This application is a 371 filing from International Patent Application No. PCT/EP2010/054705, filed Apr. 9, 2010, which claims priority from United Kingdom Patent Application No. GB0906590.5, filed Apr. 16, 2009, the disclosures of which are hereby incorporated by reference.

FIELD OF THE INVENTION

This invention relates to analog conversion of pulse width modulated (PWM) signals.

BACKGROUND

Pulse width modulation of a signal involves the modulation of the duty cycle (D) of the signal in order to carry data in a "digital form", where the duty cycle is the fraction of time that a system is in an "active" state. For example, in an ideal pulse train (having rectangular pulses), the duty cycle is the pulse duration divided by the pulse period, and represents the data value carried by the signal. In some situations it may be preferable to carry data using a PWM signal in this way.

However, in other situations it may be preferable to express the data in an analog voltage signal by an analog voltage level of the signal. Converters are known which convert PWM signals into analog voltage signals. The converters may include an amplifier and other components. The accuracy of a converted signal may be adversely affected by the offset of the amplifier and any components mismatch in the converter.

SUMMARY OF THE INVENTION

One objective of the present invention is to provide a method and apparatus for converting a PWM signal to an analog voltage signal that addresses the problem of amplifier offset and/or component mismatch.

In a first aspect there is provided a method of converting an input signal into a voltage output signal, the input signal being a periodic pulse width modulated signal, the input signal being in an active state for a first portion of each successive time periods and being in an inactive state for a second portion of each time period, the method comprising: during the first portion of a first time period of the input signal, supplying a high voltage to a first input of an integrator circuit and supplying a low voltage to a second input of the integrator circuit, the integrator circuit comprising a first output coupled to the first input via a first capacitor, and comprising a second output coupled to the second input via a second capacitor, whereby the first and second capacitors are charged to have respectively opposite charge states; during the second portion of the first time period of the input signal, supplying a low voltage to the first input of the integrator circuit and supplying a high voltage to the second input of the integrator circuit to thereby charge the first and second capacitors with respectively reversed current; holding, at a hold capacitor, the voltage difference between the voltage at the first output of the integrator circuit and the voltage at the second output of the integrator circuit at the end of the first time period of the input signal; discharging the first and second capacitors during a second time period of the input signal; during the first portion of a third time period of the input signal, supplying a low voltage to the first input of the integrator circuit and supplying a high voltage to the second input of the integrator circuit; during the second portion of the third time period of the input signal, supplying a high voltage to the first input of the integrator circuit and supplying a low voltage to the second input of the integrator circuit; holding, at the hold capacitor, the voltage difference between the second output of the integrator circuit and the first output of the integrator circuit at the end of the third time period of the input signal; and using the voltage held at the hold capacitor to provide the voltage output signal.

In a second aspect there is provided a converter for converting an input signal into a voltage output signal, the input signal being a periodic pulse width modulated signal, the input signal being in an active state for a first portion of each of successive time periods and being in an inactive state for a second portion of each time period, the converter comprising: an integrator circuit comprising a first output coupled to a first input via a first capacitor, and comprising a second output coupled to a second input via a second capacitor; supply means for supplying, during the first portion of a first time period of the input signal, a high voltage to the first input of the integrator circuit and supplying a low voltage to the second input of the integrator circuit, to charge the first and second capacitors to have respectively opposite charge states, the supply means being configured to, during the second portion of the first time period of the input signal, supply a low voltage to the first input of the integrator circuit and supply a high voltage to the second input of the integrator circuit to thereby charge the first and second capacitors with respectively reversed current; a hold capacitor configured to hold the voltage difference between the voltage at the first output of the integrator circuit and the voltage at the second output of the integrator circuit at the end of the first time period of the input signal; and means for discharging the first and second capacitors during a second time period of the input signal; wherein the supply means are configured to, during the first portion of a third time period of the input signal, supply a low voltage to the first input of the integrator circuit and supply a high voltage to the second input of the integrator circuit, and wherein the supply means are further configured to, during the second portion of the third time period of the input signal, supply a high voltage to the first input of the integrator circuit and supply a low voltage to the second input of the integrator circuit, wherein the hold capacitor is configured to hold the voltage difference between the second output of the integrator circuit and the first output of the integrator circuit at the end of the third time period of the input signal, and wherein the voltage held at the hold capacitor is used to provide the voltage output signal.

BRIEF DESCRIPTION OF THE DRAWINGS

For a better understanding of the present invention and to show how the same may be put into effect, reference will now be made, by way of example, to the following drawings in which.

DETAILED DESCRIPTION OF THE DRAWINGS

Figure 1:
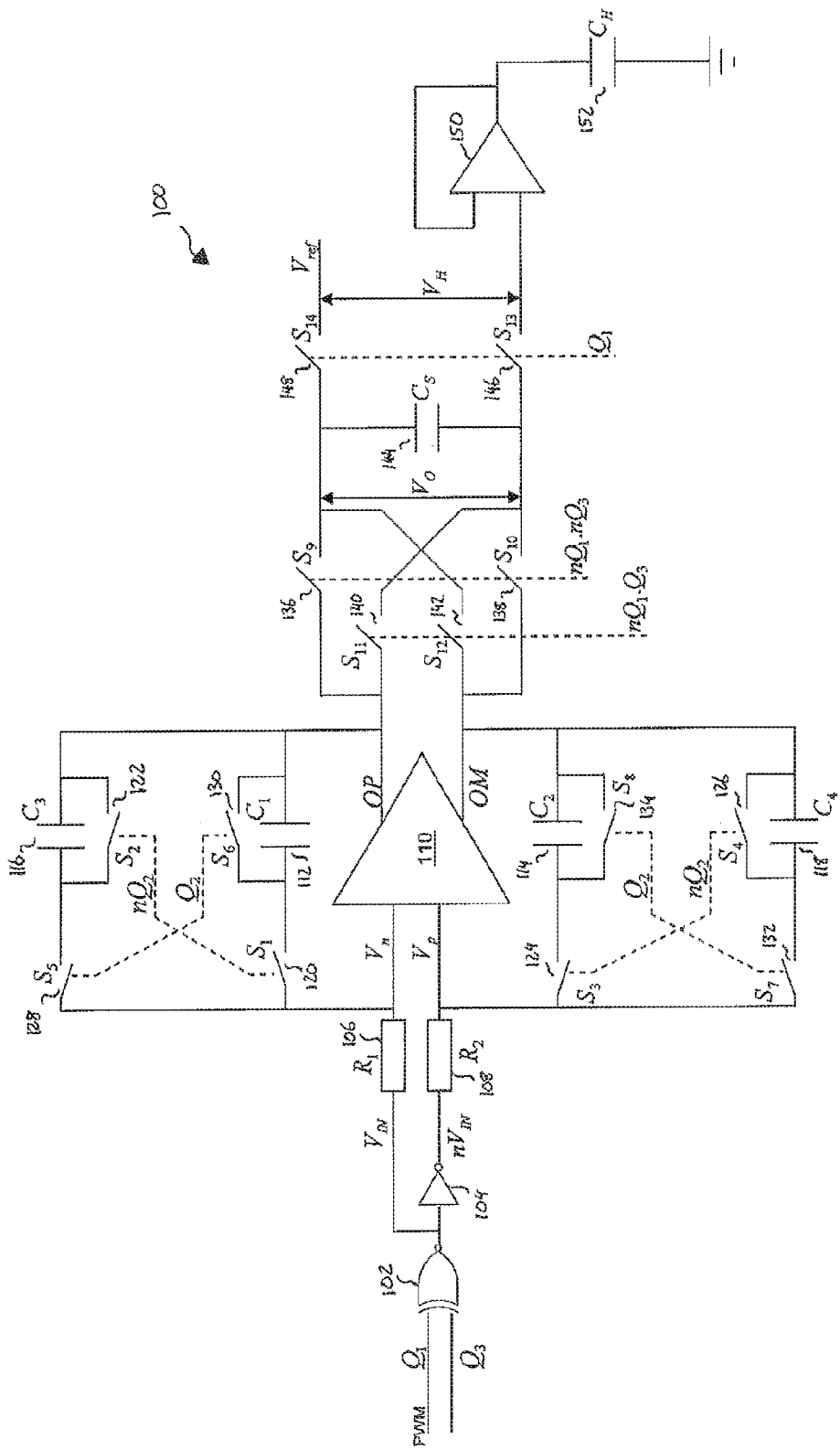
FIG. 1 is a schematic circuit diagram representing the converter circuit of the present invention according to a preferred embodiment.

Reference is first made to FIG. 1, which illustrates the converter circuit 100 of the present invention according to a preferred embodiment. The converter circuit 100 comprises an xOR gate 102, an inverter 104, a first resistor 106, a second resistor 108, an OP AMP 110 with differential inputs and differential outputs (OP, OM), a first capacitor 112, a second capacitor 114, a third capacitor 116, a fourth capacitor 118, a first switch 120, a second switch 122, a third switch 124, a fourth switch 126, a fifth switch 128, a sixth switch 130, a seventh switch 132, an eighth switch 134, a ninth switch 136, a tenth switch 138, an eleventh switch 140, a twelfth switch 142, a sampling capacitor 144, a thirteenth switch 146, a fourteenth switch 148, an output buffer 150 and a hold capacitor 152.

The PWM signal is used as a first clock signal $Q_1$. The PWM signal is also input into divider circuitry (not shown) to generate a second clock signal $Q_2$ having a period that is twice the period of the first clock signal $Q_1$. Further divider circuitry (also not shown) is used to generate a third clock signal $Q_3$ which has a period that is three times the period of the first clock signal $Q_1$. Non-overlapping switching clock circuitry (not shown) is used to generate an inverted first clock signal $nQ_1$ from the first clock signal $Q_1$, to generate an inverted second clock signal $nQ_2$ from the second clock signal $Q_2$, and to generate an inverted third clock signal $nQ_3$ from the third clock signal $Q_3$.

The PWM input signal is coupled to a first input of the xOR gate 102. The third clock signal $Q_3$ is coupled to a second input of the xOR gate 102. The output of the xOR gate 102 is coupled to the first resistor 106. The output of the xOR gate 102 is also coupled to an input of the inverter 104. An output of the inverter 104 is coupled to the second resistor 108. A first input of the OP AMP 110 is coupled to the first resistor 106 and a second input of the OP AMP 110 is coupled to the second resistor 108.

There is a first feedback path between a first output and the first input of the OP AMP 110 as described herein. The first output of the OP AMP 110 is coupled to the first capacitor 112 and to the third capacitor 116. The first capacitor 112 is coupled to the first input of the OP AMP 110 via the first switch 120. The third capacitor 116 is coupled to the first input of the OP AMP 110 via the fifth switch 128. The two sides of the first capacitor 112 are connected to each other via the sixth switch 130. The two sides of the third capacitor are connected to each other via the second switch 122. The first and second switches 120,122 are operated in accordance with the inverted second clock signal $nQ_2$. The fifth and sixth switches 128,130 are operated in accordance with the second clock signal $Q_2$.

Similarly, there is a second feedback path between a second output and the second input of the OP AMP 110 as described herein. The second output of the OP AMP 110 is coupled to the second capacitor 114 and to the fourth capacitor 118. The second capacitor 114 is coupled to the second input of the OP AMP 110 via the third switch 124. The fourth capacitor 118 is coupled to the second input of the OP AMP 110 via the seventh switch 132. The two sides of the second capacitor 114 are connected to each other via the eighth switch 134. The two sides of the fourth capacitor are connected to each other via the fourth switch 126. The third and fourth switches 124,126 are operated in accordance with the inverted second clock signal $nQ_2$. The seventh and eighth switches 132,134 are operated in accordance with the second clock signal $Q_2$.

The first output of the OP AMP 110 is coupled to a first side of the sampling capacitor 144 via the ninth switch 136 and is coupled to a second side of the sampling capacitor 144 via the eleventh switch 140. The second output of the OP AMP 110 is coupled to the first side of the sampling capacitor 144 via the twelfth switch 142 and is coupled to the second side of the sampling capacitor 144 via the tenth switch 138. The inverted first clock signal Oh and the third clock signal $Q_3$ are subjected to an AND operation to generate a fourth clock signal ($nQ_1 \cdot Q_3$). The inverted first clock signal $nQ_1$ and the inverted third clock signal $Q_3$ are subjected to an AND operation to generate a fifth clock signal ($nQ_1 \cdot nQ_3$). The ninth and tenth switches 136, 138 are operated in accordance with the fifth clock signal ($nQ_1 \cdot nQ_3$). The eleventh and twelfth switches 140, 142 are operated in accordance with the fourth clock signal ($nQ_1 \cdot Q_3$).

The first side of the sampling capacitor 144 is coupled to a reference voltage supply $V_{ref}$ via the fourteenth switch 148. The second side of the sampling capacitor is coupled to a first input of the buffer 150 via the thirteenth switch 146. The thirteenth and fourteenth switches 146, 148 are operated in accordance with the first clock signal $Q_1$. The output of the buffer 150 is coupled to a second input of the buffer 150. The output of the buffer 150 is coupled to a first side of the hold capacitor 152. A second side of the hold capacitor 152 is connected to ground.

Figure 2:
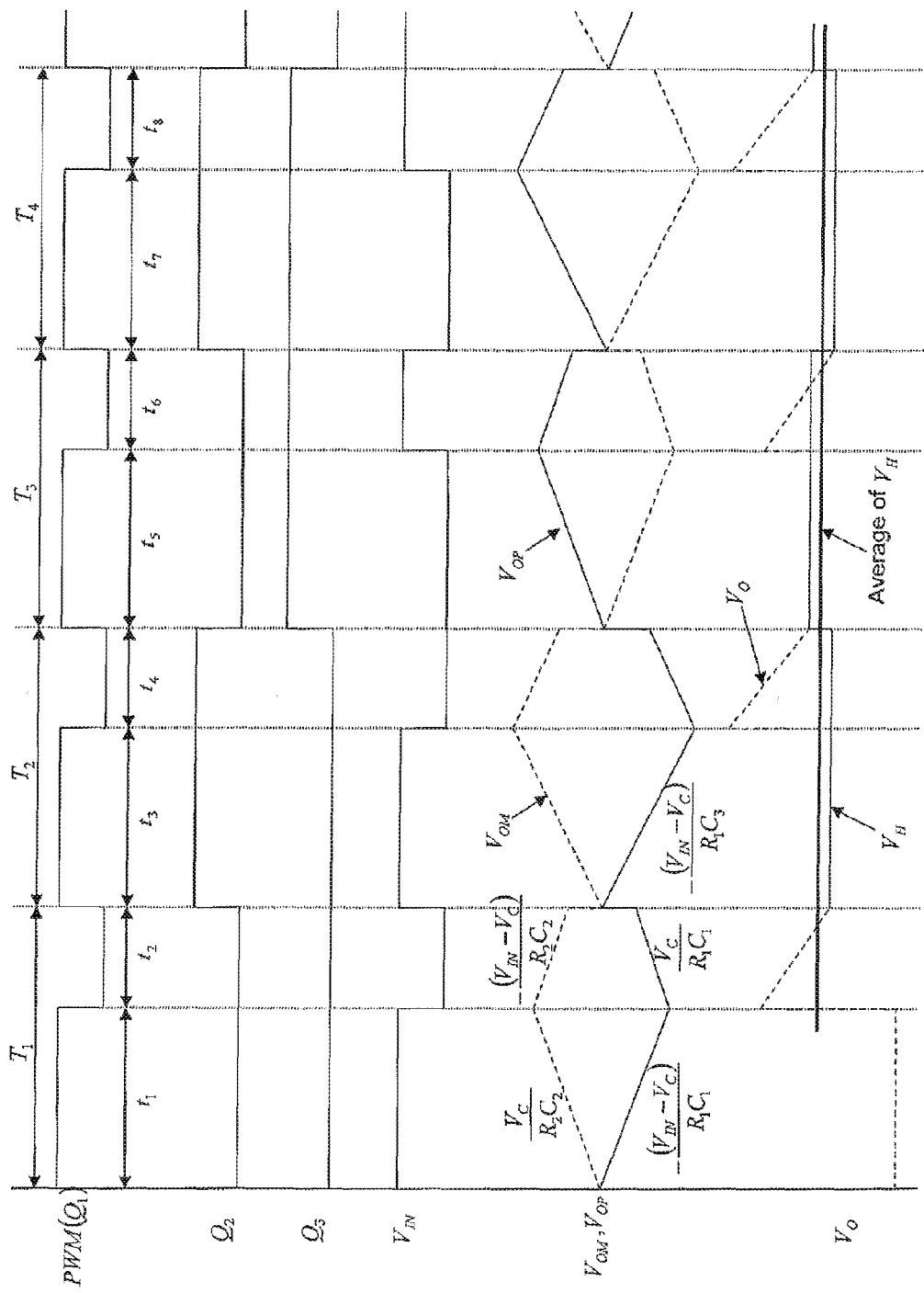
FIG. 2 is a signal diagram showing the operation of the converter circuit according to a preferred embodiment.

The operation of the converter circuit 100 is now described with reference to FIGS. 1 and 2. FIG. 2 is a signal diagram showing the operation of the converter circuit 100 of FIG. 1.

During the first time period of the PWM signal $T_1$, the PWM signal is high for a time interval $t_1$ and low for a time interval $t_2$ as shown in FIG. 2. During time interval $t_1$, the first clock signal ($Q_1$) is high, whilst the second and third clock signals ($Q_2$ and $Q_3$) are low. The result of this is that the output of the xOR gate 102 is high, such that a high voltage is supplied to the first resistor 106 and a low voltage is supplied to the second resistor 108. For example, the voltage supplied to the first resistor 106 has a value $V_{VIN}$ relative to the voltage supplied to the second resistor 108.

During time interval $t_1$ the second clock signal $Q_2$ is low. This results in the first, second, third and fourth switches (120, 122, 124, 126) being closed and the fifth, sixth, seventh and eighth switches (128, 130, 132, 134) being open. Therefore, during time interval $t_1$ the first capacitor 112 is connected between the first output (OP) and the first input of the OP AMP 110, and the second capacitor 114 is connected between the second output (OM) and the second input of the OP AMP 110. The third capacitor 116 and the fourth capacitor 118 are short-circuited by closing the second and fourth switches 122, 126 such that the third and fourth capacitors 116, 118 are discharged during time interval $t_1$.

The voltage $V_{OP}$ at the first output of the OP AMP 110 can be calculated as follows:

$$V_{OP} = V_n - \frac{1}{C_1} \int I_1 \cdot dt$$

$$V_{OP} = V_C - \left(\frac{V_{IN} - V_C}{R_1 C_1}\right) t + const$$

where t is time, $I_1$ is the current flowing into the first capacitor 112 and through the first resistor 106, and $V_C$ is the common voltage at the input of the OP AMP 110 ($V_C=V_n=V_p$).

Similarly, the voltage $V_{OM}$ at the second output of the OP AMP 110 can be calculated as follows:

$$V_{OM} = V_P + \frac{1}{C_2}\int I_2 \cdot dt$$

$$V_{OM} = V_C + \left(\frac{V_C}{R_2 C_2}\right)t + const$$

where $I_2$ is the current flowing into the second capacitor 114 and through the second resistor 108. The resistance $R_1$ of the first resistor 106 is chosen to be equal to the resistance $R_2$ of the second resistor 108. However, there may be some slight discrepancy in the resistance of the two resistors caused by component mismatching.

FIG. 2 shows that during time period $t_1$ $V_{OP}$ is decreased at a rate of $$\left(\frac{V_{IN} - V_C}{R_1 C_1}\right)$$

and $V_{OM}$ is increased at a rate of $$\left(\frac{V_C}{R_2 C_2}\right).$$

During time interval $t_1$ the first clock signal $Q_1$ is high. Therefore, the fourth clock signal ($nQ_1 \cdot Q_3$) and the fifth clock signal ($nQ_1 \cdot nQ_3$) are low. This results in the ninth, tenth, eleventh and twelfth switches 136, 138, 140, 142 being open. The sampling capacitor 144 is therefore disconnected from the OP AMP 110 and the differential output voltage $V_O$ across the sampling capacitor is low, as shown in FIG. 2.

During time interval $t_2$, the first, second and third clock signals ($Q_1$, $Q_2$ and $Q_3$) are low. The result of this is that the output of the xOR gate 102 is low, such that a low voltage is supplied to the first resistor 106 and a high voltage is supplied to the second resistor 108. For example, the voltage supplied to the second resistor 108 has a value $V_{IN}$ relative to the voltage supplied to the first resistor 106.

Similarly to during time interval during time interval $t_2$ the second clock signal $Q_2$ is low. This means that the first to eighth switches (120 to 134) and the first to fourth capacitors (112 to 118) are arranged as described above in relation to time interval $t_1$.

A similar calculation to that described above in relation to time interval leads to the result that during the time interval $t_2$ the voltage $V_{OP}$ is increased at a rate of $$\left(\frac{V_C}{R_1 C_1}\right)$$

and $V_{OM}$ is decreased at a rate of $$\left(\frac{V_{IN} - V_C}{R_2 C_2}\right),$$

as shown in FIG. 2.

During time interval $t_2$ the first clock signal $Q_1$ and the third clock signal $Q_3$ are low. Therefore the fourth clock signal ($nQ_1 \cdot Q_3$) is low and the fifth clock signal ($nQ_1 \cdot nQ_3$) is high. This results in the ninth and tenth switches (136, 138) being closed and the eleventh and twelfth switches (140, 142) being open. The first output (OP) of the OP AMP 110 is connected to the first side of the sampling capacitor 144 via the ninth switch 136 and the second output (OM) of the OP AMP 110 is connected to the second side of the sampling capacitor 144 via the tenth switch 138. The differential output voltage $V_O$ across the sampling capacitor 144 is given by the voltage difference between the two outputs of the OP AMP 110 (i.e. $V_O = V_{OM} - V_{OP}$). The difference between $V_{OM}$ and $V_{OP}$ is ramped up during $t_1$ such that at the start of time interval $t_2$ the differential output voltage $V_O$ has a high value, as shown in FIG. 2. However, during time interval $t_2$ the differential output voltage $V_O$ is ramped down as shown in FIG. 2.

Due to the difference in the duration of time intervals $t_1$ and $t_2$ and due to possible differences in the values of $R_1$ and $R_2$ and in the values of $C_1$ and $C_2$, the differential output voltage $V_O$ may be non-zero at the end of time interval $t_2$ (i.e. at the end of the first time period $T_1$ of the PWM signal). This can be seen, as an example, in FIG. 2.

The output voltage at the end of the first period of the PWM signal $T_1$ is given by:

$$V_{O1} = V_{OM} - V_{OP}$$

$$V_{O1} = DT\left(\frac{V_C}{R_2 C_2} + \frac{V_{IN} - V_C}{R_1 C_1}\right) + (1-D)T\left(-\frac{V_{IN} - V_C}{R_2 C_2} - \frac{V_C}{R_1 C_1}\right) + V_{OFF}$$

$$V_{O1} = V_{IN} DT\left(\frac{1}{R_1 C_1} + \frac{1}{R_2 C_2}\right) - \frac{V_{IN} T}{R_2 C_2} + V_C T\left(\frac{1}{R_2 C_2} - \frac{1}{R_1 C_1}\right) + V_{OFF}$$

where $V_{OFF}$ is an offset voltage of the OP AMP 110 and D is the duty cycle of the PWM signal, such that the time interval $t_1$ has a duration DT and the time interval $t_2$ has a duration (1-D)T.

During the second time period of the PWM signal $T_2$, the PWM signal is high for a time interval $t_3$ and low for a time interval $t_4$ as shown in FIG. 2. During time interval $t_3$, the first and second clock signals ($Q_1$ and $Q_2$) are high whilst the third clock signal ($Q_3$) is low.

Since the first clock signal $Q_1$ is high during the time interval $t_3$, the ninth to twelfth switches (136 to 142) are open and the thirteenth and fourteenth switches (146, 148) are closed. This means that the sampling capacitor 144 is disconnected front the outputs of the OP AMP 110. Furthermore, the first side of the sampling capacitor 144 is connected to a reference voltage $V_{ref}$ via the fourteenth switch 148 and the second side of the sampling capacitor 144 is connected to the buffer 150 via the thirteenth switch 146. In this way, the voltage held at the sampling capacitor 144 at the end of time interval $t_2$ is passed to the hold capacitor 152 via the buffer 150. The voltage passed to the hold capacitor 152 is held at the hold capacitor for the duration of the second period of the PWM signal $T_2$ as represented by $V_H$ in FIG. 2.

During time interval $t_3$ the output of the xOR gate 102 is high, such that a high voltage is supplied to the first resistor 106 and a low voltage is supplied to the second resistor 108. For example, the voltage supplied to the first resistor 106 has a value $V_{IN}$ relative to the voltage supplied to the second resistor 108.

During time interval $t_3$ the second clock signal $Q_2$ is high such that the first, second, third and fourth switches (120, 122, 124, 126) are open, and the fifth, sixth, seventh and eighth switches (128, 130, 132, 134 closed. Therefore, during time period $t_3$ the third capacitor 116 is connected between the first output (OP) and the first input of the OP AMP 110, and the fourth capacitor 118 is connected between the second output (OM) and the second input of the OP AMP 110. The first capacitor 112 and the second capacitor 114 are short-circuited by closing the sixth and eighth switches 130, 134 such that the first and second capacitors 112, 114 are discharged during time interval $t_3$.

A similar calculation to that described above in relation to time interval $t_1$, leads to the result that during the time interval $t_3$ the voltage at the first output of the OP AMP, $V_{OP}$ is given by:

$$V_{OP} = V_C - \left(\frac{V_{IN} - V_C}{R_1 C_3}\right)t + const,$$

and the voltage at the second output of the OP AMP, $V_{OM}$ is given by:

$$V_{OM} = V_C + \left(\frac{V_C}{R_2 C_4}\right)t + const.$$

FIG. 2 shows that during time interval $t_3$ $V_{OP}$ is decreased at a rate of $$\left(\frac{V_{IN} - V_C}{R_1 C_3}\right).$$

During time interval $t_3$ $V_{OM}$ is increased at a rate of $$\left(\frac{V_C}{R_2 C_4}\right).$$

During time interval $t_4$, the first and third clock signals ($Q_1$ and $Q_3$) are low whilst the second clock signal ($Q_2$) is high. The result of this is that the output of the xOR gate 102 is low, such that a low voltage is supplied to the first resistor 106 and a high voltage is supplied to the second resistor 108. For example, the voltage supplied to the second resistor 108 has a value $V_{IN}$ relative to the voltage supplied to the first resistor 106.

Similarly to during time interval $t_3$, during time interval $t_4$ the second clock signal $Q_2$ is high. This means that the first to eighth switches (120 to 134) and the first to fourth capacitors (112 to 118) are arranged in the same way as described above in relation to time interval $t_3$.

A similar calculation to that described above in relation to time interval $t_1$, leads to the result that during the time interval $t_4$ the voltage $V_{OP}$ is increased at a rate of $$\left(\frac{V_C}{R_1 C_3}\right)$$

and $V_{OM}$ is decreased at a rate of $$\left(\frac{V_{IN} - V_C}{R_2 C_4}\right).$$

During time interval $t_4$ the first clock signal $Q_1$ and the third clock signal $Q_3$ are low. Therefore, the fourth clock signal ($nQ_1 \cdot Q_3$) is low and the fifth clock signal ($nQ_1 \cdot nQ_3$) is high. This results in the ninth and tenth switches (136, 138) being closed and the eleventh and twelfth switches (140, 142) being open. The first output (OP) of the OP AMP 110 is connected to the first side of the sampling capacitor 144 via the ninth switch 136 and the second output (OM) of the OP AMP 110 is connected to the second side of the sampling capacitor 144 via the tenth switch 138. The differential output voltage $V_O (V_O = V_{OM} - V_{OP})$ is ramped up during $t_3$ such that at the start of time interval $t_4$ the differential output voltage $V_O$ has a high value, as shown in FIG. 2. However, during time interval $t_4$ the differential output voltage $V_O$ is ramped down as shown in FIG. 2.

The output voltage at the end of the second period of the PWM signal $T_2$ can be calculated in the same way as described above in relation to that at the end of the first period of the PWM signal $T_1$, such that:

$$V_{O2} = V_{IN} DT\left(\frac{1}{R_1 C_3} + \frac{1}{R_2 C_4}\right) - \frac{V_{IN} T}{R_2 C_4} + V_C T\left(\frac{1}{R_2 C_4} - \frac{1}{R_1 C_3}\right) + V_{OFF}.$$

where the time interval $t_3$ has a duration DT and the time interval $t_4$ has a duration (1-D)T.

During the third time period of the PWM signal $T_3$, the PWM signal is high for a time interval $t_5$ and tow for a time interval $t_6$ as shown in FIG. 2. During time $t_5$, the first and third clock signals ($Q_1$ and $Q_3$) are high, whilst the second clock signal ($Q_2$) is low.

Since the first clock signal $Q_1$ is high during the time interval $t_5$, the ninth to twelfth switches (136 to 142) are open and the thirteenth and fourteenth switches (146, 148) are closed. In this way the sampling capacitor 144 is disconnected from the outputs of the OP AMP 110. Furthermore, the first side of the sampling capacitor 144 is connected to the reference voltage $V_{ref}$ via the fourteenth switch 148 and the second side of the sampling capacitor 144 is connected to the buffer 150 via the thirteenth switch 146. In this way, the voltage held at the sampling capacitor 144 at the end of time interval $t_4$ is passed to the hold capacitor 152 via the buffer 150. The voltage passed to the hold capacitor 152 is held at the hold capacitor for the duration of the third period of the PWM signal $T_3$ as represented by $V_H$ in FIG. 2.

During the time interval $t_5$ the output of the xOR gate 102 is low, such that a tow voltage is supplied to the first resistor 106 and a high voltage is supplied to the second resistor 108. For example, the voltage supplied to the second resistor 108 has a value $V_{IN}$ relative to the voltage supplied to the first resistor 106.

Since the second clock signal $Q_2$ is low during time interval $t_5$, the first, second, third and fourth switches (120, 122, 124, 126) are closed and the fifth, sixth, seventh and eighth switches (128, 130, 132, 134) are open, such that the first capacitor 112 is connected between the first output (OP) and the first input of the OP AMP 110, and the second capacitor 114 is connected between the second output (OM) and the second input of the OP AMP 110. The third capacitor 116 and the fourth capacitor 118 are short-circuited by closing the second and fourth switches 122, 126 such that the third and fourth capacitors 116, 118 are discharged during time interval $t_5$.

As described above, the first and second capacitors (112 and 114) are discharged during the second time period of the PWM signal $T_2$. This means that at the start of time interval $t_5$ there is substantially a zero voltage difference across the first and second capacitors (112, 114). The voltage $V_{OP}$ at the first output of the OP AMP 110 is given by:

$$V_{OP} = V_C + \left(\frac{V_C}{R_1 C_1}\right) t + const,$$

and the voltage $V_{OM}$ at the second output of the OP AMP 110 is given by:

$$V_{OM} = V_C - \left(\frac{V_{IN} - V_C}{R_2 C_2}\right) t + const.$$

During time interval $t_6$, the first and second clock signals ($Q_1$ and $Q_2$) are tow whilst the third clock signal $Q_3$ is high. The result of this is that the output of the xOR gate 102 is high, such that a high voltage is supplied to the first resistor 106 and a low voltage is supplied to the second resistor 108. For example, the voltage supplied to the first resistor 106 has a value $V_N$ relative to the voltage supplied to the second resistor 108.

As the second clock signal $Q_2$ is low, the first to eighth switches (120 to 134) and the first to fourth capacitors (112 to 118) are arranged in the same way as described above in relation to time interval $t_5$.

During the time interval $t_6$ the voltage $V_{OP}$ is decreased at a rate of $$\left(\frac{V_{IN} - V_C}{R_1 C_1}\right)$$

and $V_{OM}$ is increased at a rate of $$\left(\frac{V_C}{R_2 C_2}\right).$$

During time interval $t_6$ the first clock signal $Q_1$ is low and the third clock signal $Q_3$ is high. Therefore the fourth clock signal ($nQ_1 \cdot Q_3$) is high and the fifth clock signal ($nQ_1 \cdot nQ_3$) is low. This results in the ninth and tenth switches (136, 138) being open and the eleventh and twelfth switches (140, 142) being closed. The first output (OP) of the OP AMP 110 is connected to the second side of the sampling capacitor 144 via the eleventh switch 140 and the second output (OM) of the OP AMP 110 is connected to the first side of the sampling capacitor 144 via the twelfth switch 142. The differential output voltage $V_O$ across the sampling capacitor 144 is given by the voltage difference between the two outputs of the OP AMP 110 (i.e. $V_O = V_{OP} - V_{OM}$). The difference between $V_{OP}$ and $V_{OM}$ is ramped up during $t_5$ such that at the start of time interval $t_6$ the differential output voltage $V_O$ has a high value, as shown in FIG. 2. However, during time interval $t_6$ the differential output voltage $V_O$ is ramped down as shown in FIG. 2.

The output voltage at the end of the third period of the PWM signal $T_3$ is given by:

$$V_{O3} = V_{OP} - V_{OM}$$

$$V_{O3} = DT\left(\frac{V_C}{R_1 C_1} + \frac{V_{IN} - V_C}{R_2 C_2}\right) + (1-D)T\left(-\frac{V_{IN} - V_C}{R_1 C_1} - \frac{V_C}{R_2 C_2}\right) - V_{OFF}$$

$$V_{O3} = V_{IN} DT\left(\frac{1}{R_2 C_2} + \frac{1}{R_1 C_1}\right) - \frac{V_{IN} T}{R_1 C_1} + V_C T\left(\frac{1}{R_1 C_1} - \frac{1}{R_2 C_2}\right) - V_{OFF}$$

where the time interval $t_5$ has a duration DT and the time interval $t_6$ has a duration (1-D)T. It should be noted that during the third period of the PWM signal the outputs of the OP AMP 110 are interchanged (as compared to during the first period of the PWM signal $T_1$) with regards to which side of the sampling capacitor 144 they are connected to. This swapping of the outputs is effected by closing the eleventh and twelfth switches (140, 142) during the third time period of the PWM signal $t_3$ (rather than closing the ninth and tenth switches 136, 138 which is done during the first time period of the PWM signal $T_1$). This exchange of the outputs of the OP AMP 110 means that the offset voltage $V_{OFF}$ of the OP AMP 110 occurs as a positive term in the equation for $V_{O1}$ and occurs as a negative term in the equation for $V_{O3}$.

During the fourth time period of the PWM signal $T_4$, the PWM signal is high for a time interval $t_7$ and low for a time interval $t_8$ as shown in FIG. 2. During time interval $t_7$, the first, second and third clock signals ($Q_1$, $Q_2$ and $Q_3$) are high.

Since the first clock signal $Q_1$ is high during the time interval $t_7$, the ninth to twelfth switches (136 to 142) are open and the thirteenth and fourteenth switches (146, 148) are closed. This means that the sampling capacitor 144 is disconnected from the outputs of the OP AMP 110. Furthermore, the first side of the sampling capacitor 144 is connected to a reference voltage $V_{ref}$ via the fourteenth switch 148 and the second side of the sampling capacitor 144 is connected to the buffer 150. In this way, the voltage held at the sampling capacitor 144 at the end of time interval $t_6$ is passed to the hold capacitor 152 via the buffer 150. The voltage passed to the hold capacitor 152 is held at the hold capacitor for the duration of the fourth time period of the PWM signal $T_4$ as represented by $V_H$ in FIG. 2.

The average of the output voltage $V_{O1}$ at the end of the first time period of the PWM signal $T_1$ and the output voltage $V_{O3}$ at the end of the third time period of the PWM signal $T_3$ is given by:

$$V_{O13} = \frac{1}{2}(V_{O1} + V_{O3})$$

$$V_{O13} = V_{IN} T (2D-1)\left(\frac{1}{2}\right)\left(\frac{1}{R_1 C_1} + \frac{1}{R_2 C_2}\right)$$

It can be seen that by taking the average of the output voltage at the end of the first and third time periods of the PWM signal, the offset voltage $V_{OFF}$ is substantially eliminated from the output voltage. This is due to the swapping of the outputs of the OP AMP 110 in relation to the sampling capacitor 144 as described above. Furthermore, the factor $$\left(\frac{1}{2}\right)\left(\frac{1}{R_1 C_1} + \frac{1}{R_2 C_2}\right)$$

substantially eliminates from the output voltage the effect of mismatch between the values of $R_1$ and $R_2$ and between the values of $C_1$ and $C_2$.

It can also be seen that the average output voltage $V_{O13}$ is proportional to the duration of the PWM signal, i.e. the duty cycle of the PWM signal, D. For D=0.5 the average of the output voltage is zero.

During time interval $t_7$ the output of the xOR gate 102 is low, such that a low voltage is supplied to the first resistor 106 and a high voltage is supplied to the second resistor 108. For example, the voltage supplied to the second resistor 108 has a value $V_{IN}$ relative to the voltage supplied to the first resistor 106.

During time interval $t_7$ the second clock signal $Q_2$ is high such that the first, second, third and fourth switches (120, 122, 124, 126) are open, and the fifth, sixth, seventh and eighth switches (128, 130, 132, 134) are closed. Therefore, during time period $t_7$ the third capacitor 116 is connected between the first output (OP) and the first input of the OP AMP 110, and the fourth capacitor 118 is connected between the second output (OM) and the second input of the OP AMP 110. The first capacitor 112 and the second capacitor 114 are short-circuited by closing the sixth and eighth switches 130, 134 such that the first and second capacitors 112, 114 are discharged during time period $t_7$.

As described above, the third and fourth capacitors (116 and 118) are discharged during the third time period of the PWM signal $T_3$. This means that at the start of time interval $t_7$ there is substantially a zero voltage difference across the third and fourth capacitors (116, 118). During the time interval $t_7$ the voltage $V_{OP}$ is given by:

$$V_{OP} = V_C + \left(\frac{V_C}{R_1 C_3}\right) t + const,$$

and the voltage $V_{OM}$ is given by:

$$V_{OM} = V_C - \left(\frac{V_{IN} - V_C}{R_2 C_4}\right) t + const.$$

Therefore, during time interval $t_7$ $V_{OP}$ is increased at a rate of $$\left(\frac{V_C}{R_1 C_3}\right)$$

and $V_{OM}$ is decreased at a rate of $$\left(\frac{V_{IN} - V_C}{R_2 C_4}\right).$$

During time interval $t_8$, the first clock signal ($Q_1$) is low Whilst the second and third clock signals ($Q_2$ and $Q_3$) are high. The result of this is that the output of the xOR gate 102 is high, such that a high voltage is supplied to the first resistor 106 and a low voltage is supplied to the second resistor 108. For example, the voltage supplied to the first resistor 106 has a value $V_{IN}$ relative to the voltage supplied to the second resistor 108.

Similarly to during time interval $t_7$, during time interval $t_8$ the second clock signal $Q_2$ is high. This means that the first to eighth switches (120 to 134) and the first to fourth capacitors (112 to 118) are arranged in the same way as described above in relation to time interval $t_7$.

A similar calculation to that described above in relation to time interval $t_1$, leads to the result that during time interval $t_8$, $V_{OP}$ is decreased at a rate of $$\left(\frac{V_{IN} - V_C}{R_1 C_3}\right)$$

and $V_{OM}$ is increased at a rate of $$\left(\frac{V_C}{R_2 C_4}\right).$$

During time interval $t_8$ the first clock signal $Q_1$ is low and the third clock signal $Q_3$ is high. Therefore, the fourth clock signal ($nQ_1 \cdot Q_3$) is high and the fifth clock signal ($nQ_1 \cdot nQ_3$) is low. This results in the ninth and tenth switches (136, 138) being open and the eleventh and twelfth switches (140, 142) being closed. The first output (OP) of the OP AMP 110 is connected to the second side of the sampling capacitor 144 via the eleventh switch 140 and the second output (OM) of the OP AMP 110 is connected to the first side of the sampling capacitor 144 via the twelfth switch 142. The differential output voltage $V_O$ across the sampling capacitor 144 is given by the voltage difference between the two outputs of the OP AMP 110 (i.e. $V_O = V_{OP} - V_{OM}$). The difference between $V_{OP}$ and $V_{OM}$ is ramped up during $t_7$ such that at the start of time interval $t_8$ the differential output voltage $V_O$ has a high value, as shown in FIG. 2. However, during time interval $t_8$ the differential output voltage $V_O$ is ramped down as shown in FIG. 2.

The output voltage at the end of the fourth time period of the PWM signal $T_4$ is given by:

$$V_{O4} = V_{IN} DT \left(\frac{1}{R_1 C_3} + \frac{1}{R_2 C_4}\right) - \frac{V_{IN} T}{R_1 C_3} + V_C T \left(\frac{1}{R_1 C_3} - \frac{1}{R_2 C_4}\right) - V_{OFF}.$$

where the time interval $t_7$ has a duration DT and the time interval $t_8$ has a duration (1-D)T.

The average of the output voltages at the end of the first to fourth time periods of the PWM signal ($T_1$ to $T_4$) is given by:

$$\langle V_O \rangle = \frac{1}{4}(V_{O1} + V_{O2} + V_{O3} + V_{O4})$$

$$\langle V_O \rangle = V_{IN} T (2D - 1) K$$

$$\text{where } K = \frac{1}{4}\left(\frac{1}{R_1 C_1} + \frac{1}{R_1 C_3} + \frac{1}{R_2 C_2} + \frac{1}{R_2 C_4}\right).$$

It can be seen that by taking the average of the output voltage at the end of the first to fourth time periods of the PWM signal the offset voltage $V_{OFF}$ is substantially eliminated from the output voltage. Furthermore, the K factor substantially eliminates from the output voltage the effect of mismatch between the values of $R_1$ and $R_2$ and between the values of $C_1$, $C_2$, $C_3$ and $C_4$. In this way the offset of the OP AMP 110 and any components mismatch is eliminated by applying a chopping technique that controls the voltage supplied to the inputs of the integrator circuit in accordance with a clock derived from the PWM signal as described above.

It can also be seen that the average output voltage $\langle V_O \rangle$ is proportional to the duration of the PWM signal, i.e. the duty cycle of the PWM signal, D. For D=0.5 the average of the output voltage is zero.

The cycle of operations described above over four time periods ($T_1$ to $T_4$) of the PWM signal may be repeated for every four time periods of the PWM signal that are received to reduce the effects of voltage offset and component mismatch when converting the PWM signal to a voltage output signal.

However, a mismatch in the components used in the converter circuit 100 may cause a change in the value of $V_C$ during the operation of the converter circuit 100 during the integration time). This change in $V_C$ may create a deviation in the output voltage, which can be expressed in the worst case by:

$$\Delta V_O = \frac{V_{IN}}{4}\left[\left(\frac{T}{RC}\frac{\Delta R}{R}\right)^2 + \left(\frac{T}{RC}\frac{\Delta C}{C}\right)^2\right].$$

The deviation ($\Delta V_O$) is usually small.

The deviation in the output voltage ($\Delta V_O$) may be avoided in a second embodiment of the invention by replacing the matched first and second resistors (106, 108) with matched first and second current sources. A converter circuit 300 according to the second embodiment is shown in FIG. 3.

Figure 3:
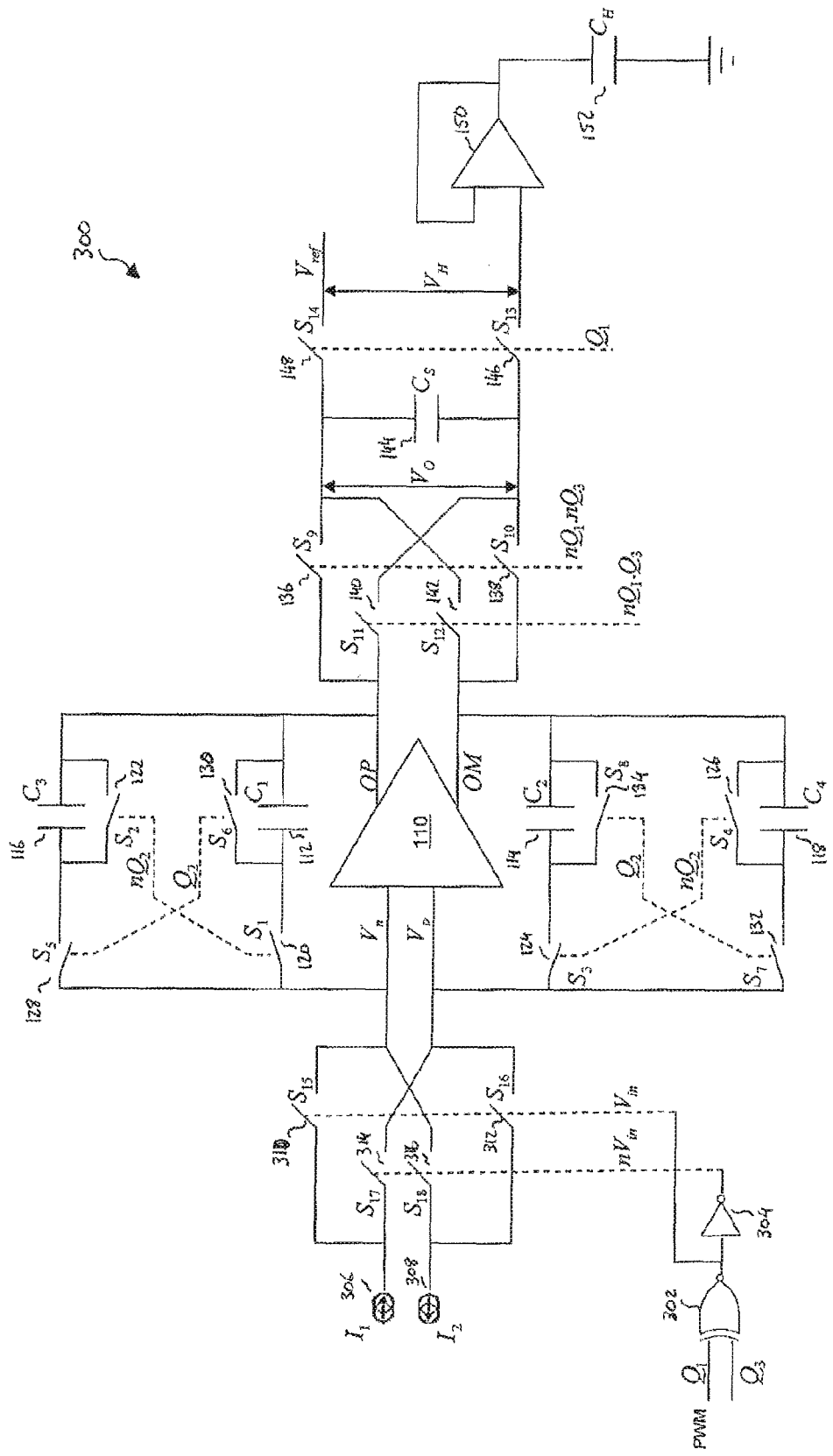
FIG. 3 is a schematic circuit diagram representing the converter circuit of the present invention according to a second embodiment.

The converter circuit 300 shown in FIG. 3 has many corresponding components to those of the converter circuit 100 shown in FIG. 1, which are labelled with corresponding reference numerals and are not discussed further here in relation to the second embodiment shown in FIG. 3.

The converter circuit of FIG. 3 does not include the xOR gate 102, inverter 104, first resistor 106 or the second resistor 108 of the first embodiment shown in FIG. 1. Instead the converter circuit 300 of the second embodiment comprises a second xOR gate 302, a second inverter 304, a first current source 306, a second current source 308, a fifteenth switch 310, a sixteenth switch 312, a seventeenth switch 314 and an eighteenth switch 316.

The PWM input signal is coupled to a first input of the second xOR gate 302. The third clock signal $Q_3$ is coupled to a second input of the second xOR gate 302. The output of the second xOR gate 302 is coupled to an input of the second inverter 304. An output of the first current source 306 is coupled to the fifteenth switch 310 and to the seventeenth switch 314. An output of the second current source 308 is coupled to the sixteenth switch 312 and to the eighteenth switch 316. The first input of the OP AMP 110 is coupled to the fifteenth switch 310 and to the eighteenth switch 316. The second input of the OP AMP 110 is coupled to the sixteenth switch 312 and to the seventeenth switch 314. The fifteenth and sixteenth switches 310,312 are operated in accordance with the output of the second xOR gate 302. The seventeenth and eighteenth switches 314,316 are operated in accordance with the output of the second inverter 304.

In operation, when the output of the second xOR gate 302 is high the first current source 306 is connected to the first input of the OP AMP 110 and the second current source 308 is connected to the second input of the OP AMP 110. When the output of the second xOR gate 302 is low the second current source 308 is connected to the first input of the OP AMP 110 and the first current source 306 is connected to the second input of the OP AMP 110. The remainder of the converter circuit 300 is operated in the same way as the converter circuit 100 described above.

The current sources are matched such that $$I_1 = -I_2 = \frac{V_{IN}}{R},$$

where $I_1$ is the current produced by the first current source 306, $I_2$ is the current produced by the second current source 308 and $R=R_1=R_2$. Any mismatch in the first and second current sources 306, 308 may be cancelled in the same way that the mismatch in the first and second resistors 106, 108 is cancelled as described above.

Figure 4:
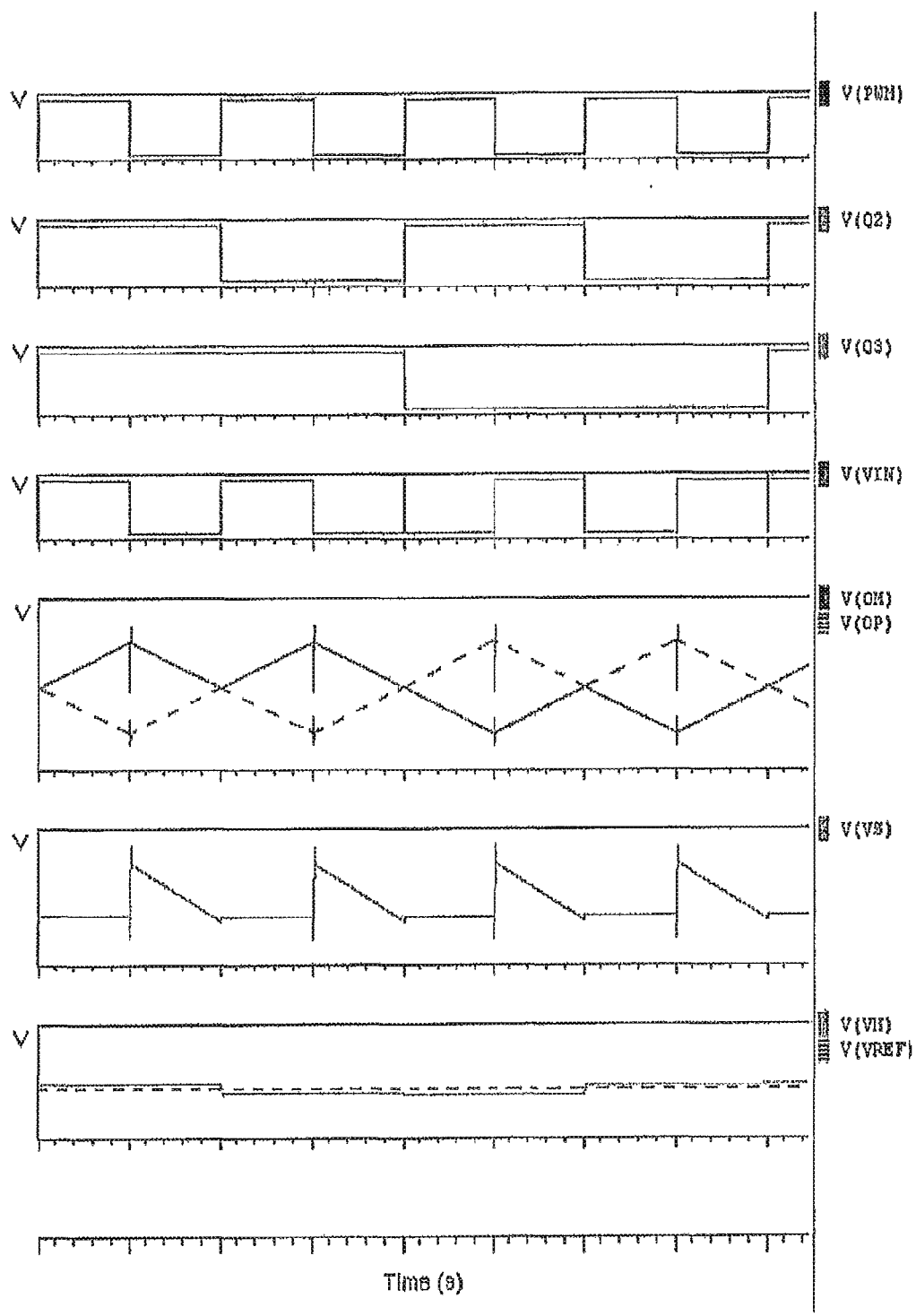
FIG. 4 shows simulation graphs for the converter circuit of an embodiment in which D=0.5, $V_{off}$=5 mV, $\Delta R$=0.1 R and $\Delta C$=0.1 C.
Figure 5:
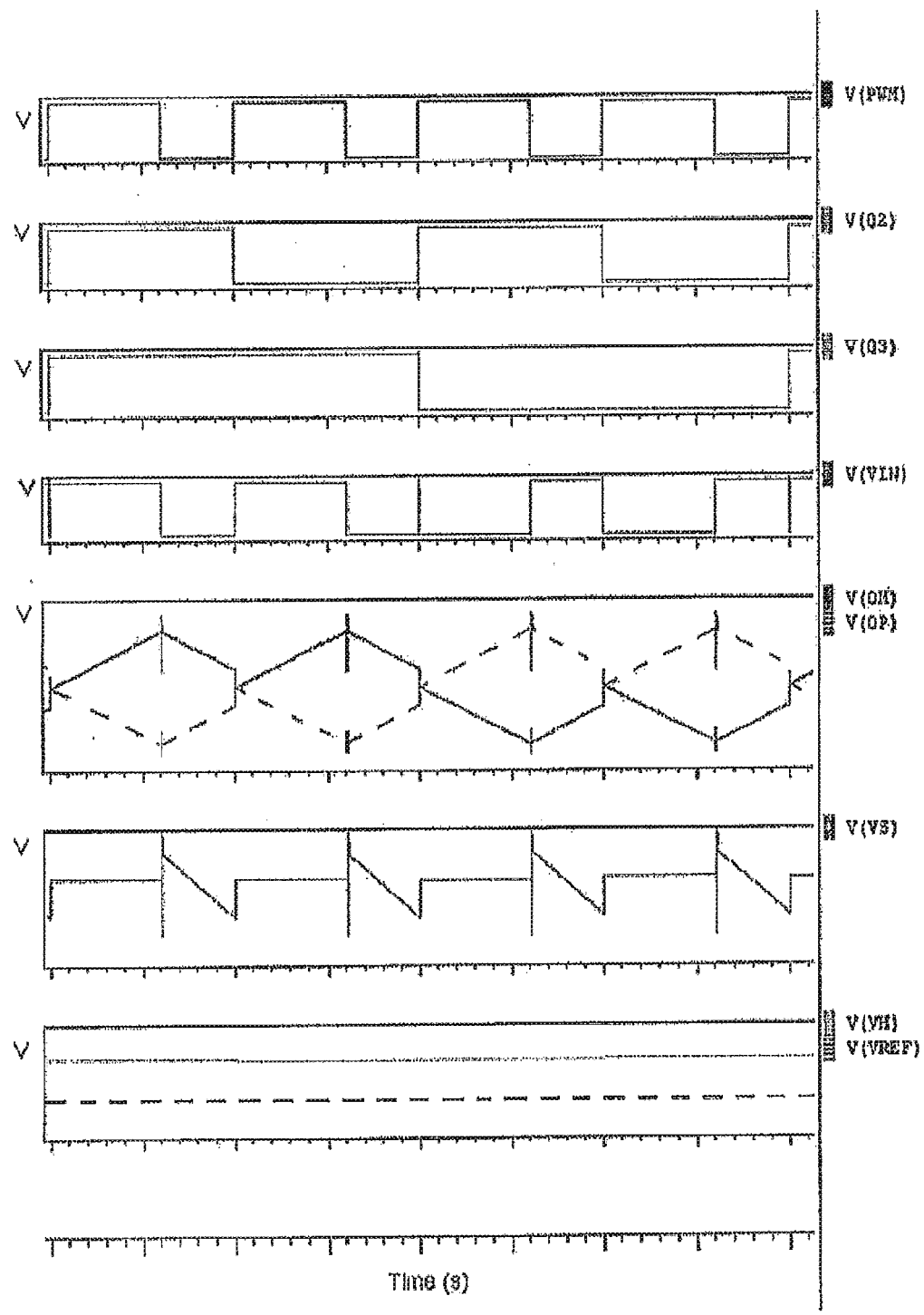
FIG. 5 shows simulation graphs for the converter circuit of an embodiment in which D=0.6, $V_{off}$=5 mV, ΔR=0.1 R and ΔC=0.1 C.
Figure 6:
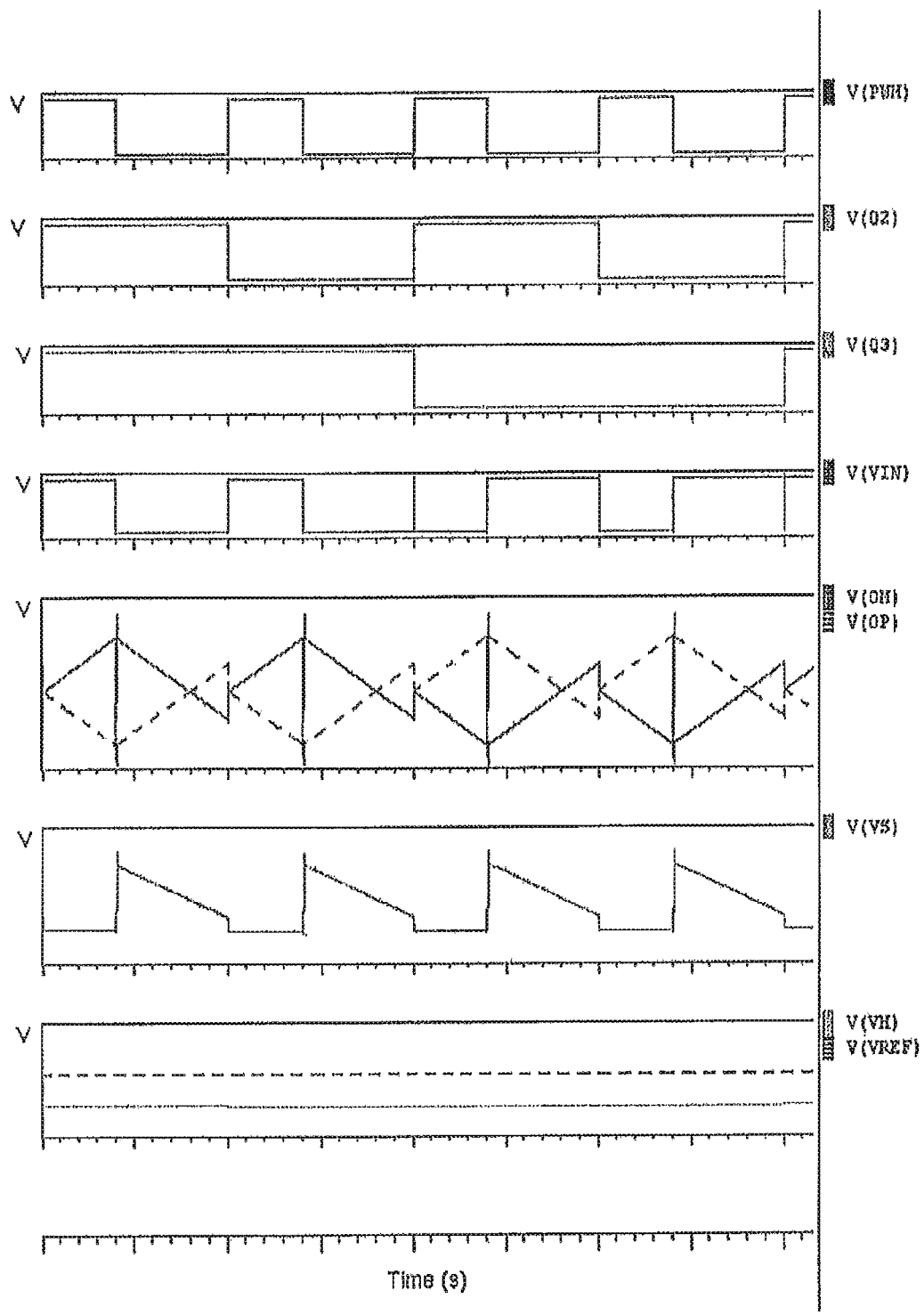
FIG. 6 shows simulation graphs for the converter circuit of an embodiment in which D=0.4, $V_{off}$=5 mV, ΔR=0.1 R and ΔC=0.1 C.

FIGS. 4 to 6 show simulations of values of various parameters of the converter circuit for different input PWM signals. In particular, FIG. 4 shows simulation graphs for the converter circuit of an embodiment in which D=0.5, $V_{off}$=5 mV, $\Delta R$=0.1 R and $\Delta C$=0.1 C. It can be seen that since D=0.5 the average of the output voltage $V_{11}$ is approximately equal to the reference voltage level $V_{ref}$. The slight fluctuations in $V_H$ between different time periods of the PWM signal can be seen due to component mismatch and/or an OP AMP offset, but the average of $V_H$ substantially eliminates these fluctuations.

FIG. 5 shows simulation graphs for the converter circuit of an embodiment in which D=0.6, $V_{off}$=5 mV, $\Delta R$=0.1 R and $\Delta C$=0.1 C. It can be seen that since D is greater than 0.5 the average output voltage level $V_H$ is positive (i.e. above the reference voltage $V_{ref}$) in accordance with the equation for $\langle V_O \rangle$ above. The output voltage $V_H$ is positive because the PWM signal is high for a longer time interval than it is low. This results in the output voltage $V_O$ of the OP AMP 110 ramping up for longer than it is ramped down over a time period of the PWM signal. Therefore the output voltage at the end of a time period of the PWM signal has a positive value.

FIG. 6 shows simulation graphs for the converter circuit of an embodiment in which D=0.4, $V_{off}$=5 mV, $\Delta R$=0.1 R and $\Delta C$=0.1 C. It can be seen that since D is less than 0.5 the average output voltage level $V_H$ is negative (i.e. below the reference voltage $V_{ref}$) in accordance with the equation for $\langle V_O \rangle$ above. The output voltage $V_H$ is negative because the PWM signal is high for a shorter time interval than it is low. This results in the output voltage $V_O$ of the OP AMP 110 ramping up for less time than it is ramped down over a time period of the PWM signal. Therefore the output voltage at the end of a time period of the PWM signal has a negative value.

It will be appreciated that the above embodiments are described only by way of example. Other applications and configurations may be apparent to the person skilled in the art given the disclosure herein. The scope of the invention is not limited by the described embodiments, but only by the following claims.

The invention claimed is:

1. A method of converting an input signal into a voltage output signal, the input signal being a periodic pulse width modulated signal, the input signal being in an active state for a first portion of each of successive time periods and being in an inactive state for a second portion of each time period, the method comprising:
   supplying a first and second input to an integrator circuit;
   coupling for a first time period of the pulse width modulated signal a first capacitor between a first output of the integrator circuit and the first input and a second capacitor between a second output of the integrator circuit and the second input;

coupling for a successive second time period of the pulse width modulated signal a third capacitor between a first output of the integrator circuit and the first input and a fourth capacitor between a second output of the integrator circuit and the second input; and charging said coupled capacitors during the active state of the first and second time periods and discharging said coupled capacitors during the inactive state of the first and second time periods.

2. The method as claimed in claim 1, wherein said first and second time periods are equal.

3. The method of claim 1 wherein when said first and second capacitors are coupled between said outputs of said integrator and said inputs, said third and fourth capacitors are operable to be discharged and when said second and third capacitors are coupled between said outputs of said integrator and said inputs, said first and second capacitors are operable to be discharged.

4. The method of claim 1 further comprising: coupling for a second portion of the first and second time periods the first output of the integrator to a first side of a sampling capacitor and a second output of the integrator to a second side of the sampling capacitor.

5. The method of claim 1 further comprising:
coupling for a third time period of the pulse width modulated signal the first capacitor between the first output of the integrator circuit and the first input and the second capacitor between the second output of the integrator circuit and the second input;
coupling for a successive fourth time period of the pulse width modulated signal the third capacitor between a first output of the integrator circuit and the first input and the fourth capacitor between a second output of the integrator circuit and the second input; and
charging said coupled capacitors during the active state of the third and fourth time periods and discharging said coupled capacitors during the inactive state of the third and fourth time periods.

6. The method of claim 5 further comprising: coupling for a second portion of the third and fourth time periods the first output of the integrator to the second side of a sampling capacitor and a second output of the integrator to the first side of the sampling capacitor.

7. The method of claim 4 further comprising disconnecting the sampling capacitor from the first and second outputs of the integrator for the first portion of each time period.

8. The method of claim 4 wherein the sampling capacitor is connected to a buffer for the first portion of each time period, such that the sampled voltage at the sampling capacitor is passed to a hold capacitor via the buffer.

9. An apparatus for converting an input signal into a voltage output signal, the input signal being a periodic pulse width modulated signal, the input signal being in an active state for a first portion of each of successive time periods and being in an inactive state for a second portion of each time period, the apparatus comprising:
an integrator circuit comprising a first and second input and a first and second output;
a first capacitor operable to be coupled between said first output and said first input for a first time period of the pulse width modulated signal;
a second capacitor operable to be coupled between said second output and said second input for said first time period;
a third capacitor operable to be coupled between said first output and said first input for a successive second time period of the pulse width modulated signal; and
a fourth capacitor operable to be coupled between said second output and said second input for said successive second time period;
wherein said apparatus is operable to charge said coupled capacitors during the active state of said first and second time periods and discharge said coupled capacitors during the inactive state of said first and second time periods.

10. The apparatus of claim 9, wherein said first and second periods are equal.

11. The apparatus of claim 9 wherein when said first and second capacitors are operable to be coupled between said outputs of said integrator and said inputs, said third and fourth capacitors are operable to be discharged and when said second and third capacitors are coupled between said outputs of said integrator and said inputs, said first and second capacitors are operable to be discharged.

12. The apparatus of claim 9 further comprising: a sampling capacitor, the apparatus operable to couple for a second portion of the first and second time periods the first output of the integrator to a first side of a sampling capacitor and a second output of the integrator to a second side of the sampling capacitor.

13. The apparatus of claim 9, wherein
the first capacitor is further operable to be coupled between the first output of the integrator circuit and the first input and the second capacitor is further operable to be coupled between the second output of the integrator circuit and the second input for a third time period of the pulse width modulated signal; and
the third capacitor is further operable to be coupled between the first output of the integrator circuit and the first input and the fourth capacitor if further operable to be coupled between a second output of the integrator circuit and the second input for a successive fourth time period of the pulse width modulated signal; and
the apparatus is further operable to charge said coupled capacitors during the active state of the third and fourth time periods and discharge said coupled capacitors during the inactive state of the third and fourth time periods.

14. The apparatus of claim 13 further comprising: a sampling capacitor, the apparatus operable to couple for a second portion of the third and fourth time periods the first output of the integrator to a second side of a sampling capacitor and a second output of the integrator to a first side of the sampling capacitor.

15. The apparatus of claim 12 wherein the apparatus is further operable to disconnect the sampling capacitor from the first and second outputs of the integrator for the first portion of each time period.

16. A method of converting a periodic pulse width modulated signal into an output signal, comprising:
generating a first and second output from an integrator circuit;
connecting for a first logic state time interval of a switch control signal derived from the pulse width modulated signal the first and second output of the integrator circuit to a first and second plates, respectively, of a capacitor; and
connecting for a second logic state time interval of said switch control signal derived from the pulse width modulated signal the first and second output of the integrator circuit to the second and first plates, respectively, of the capacitor.

17. The method according to claim 16, further comprising generating said switch control signal by logically combining said pulse width modulated signal with a reference clock having a period which is an integer multiple of a period of the periodic pulse width modulated signal.

18. An apparatus for converting a periodic pulse width modulated signal to an output signal, comprising:
  an integrator circuit comprising a first and second output;
  a first capacitor comprising a first plate and a second plate;
  a switching circuit configured to connect said first and second output to said first and second plates, respectively, for a first logic state time interval of a switch control signal derived from the pulse width modulated signal and connect said first and second output to said second and first plates, respectively, for a second logic state time interval of said switch control signal derived from the pulse width modulated signal.

19. A method of converting an input signal into a voltage output signal, the input signal being a periodic pulse width modulated signal, the input signal being in an active state for a first portion of each of successive time periods and being in an inactive state for a second portion of each time period, the method comprising:
  during the first portion of a first time period of the input signal, supplying a high voltage to a first input of an integrator circuit and supplying a low voltage to a second input of the integrator circuit, the integrator circuit comprising a first output coupled to the first input via a first capacitor, and comprising a second output coupled to the second input via a second capacitor, whereby the first and second capacitors are charged to have respectively opposite charge states;
  during the second portion of the first time period of the input signal, supplying a low voltage to the first input of the integrator circuit and supplying a high voltage to the second input of the integrator circuit to thereby charge the first and second capacitors with respectively reversed current;
  holding, at a hold capacitor, the voltage difference between the voltage at the first output of the integrator circuit and the voltage at the second output of the integrator circuit at the end of the first time period of the input signal;
  discharging the first and second capacitors during a second time period of the input signal;
  during the first portion of a third time period of the input signal, supplying a low voltage to the first input of the integrator circuit and supplying a high voltage to the second input of the integrator circuit;
  during the second portion of the third time period of the input signal, supplying a high voltage to the first input of the integrator circuit and supplying a low voltage to the second input of the integrator circuit;
  holding, at the hold capacitor, the voltage difference between the second output of the integrator circuit and the first output of the integrator circuit at the end of the third time period of the input signal; and
  using the voltage held at the hold capacitor to provide the voltage output signal;
  wherein the first output of the integrator circuit is further coupled to the first input via a third capacitor, and the second output of the integrator circuit is further coupled to the second input via a fourth capacitor, the method further comprising:
    discharging the third and fourth capacitors during the first and third time periods of the input signal;
    during the first portion of the second time period of the input signal, supplying a high voltage to the first input of the integrator circuit and supplying a low voltage to the second input of the integrator circuit, whereby the third and fourth capacitors are charged to have respectively opposite charge states;
    during the second portion of the second time period of the input signal, supplying a low voltage to the first input of the integrator circuit and supplying a high voltage to the second input of the integrator circuit to thereby charge the third and fourth capacitors with respectively reversed current;
    holding, at the hold capacitor, the voltage difference between the voltage at the first output of the integrator circuit and the voltage at the second output of the integrator circuit at the end of the second time period of the input signal;
    during the first portion of a fourth time period of the input signal, supplying a low voltage to the first input of the integrator circuit and supplying a high voltage to the second input of the integrator circuit;
    during the second portion of the fourth time period of the input signal, supplying a high voltage to the first input of the integrator circuit and supplying a low voltage to the second input of the integrator circuit; and
    holding, at the hold capacitor, the voltage difference between the voltage at the second output of the integrator circuit and the voltage at the first output of the integrator circuit at the end of the fourth time period of the input signal.

20. A converter for converting an input signal into a voltage output signal, the input signal being a periodic pulse width modulated signal, the input signal being in an active state for a first portion of each of successive time periods and being in an inactive state for a second portion of each time period, the converter comprising:
  an integrator circuit comprising a first output coupled to a first input via a first capacitor, and comprising a second output coupled to a second input via a second capacitor;
  supply means for supplying, during the first portion of a first time period of the input signal, a high voltage to the first input of the integrator circuit and supplying a low voltage to the second input of the integrator circuit, to charge the first and second capacitors to have respectively opposite charge states, the supply means being configured to, during the second portion of the first time period of the input signal, supply a low voltage to the first input of the integrator circuit and supply a high voltage to the second input of the integrator circuit to thereby charge the first and second capacitors with respectively reversed current;
  a hold capacitor configured to hold the voltage difference between the voltage at the first output of the integrator circuit and the voltage at the second output of the integrator circuit at the end of the first time period of the input signal; and
  means for discharging the first and second capacitors during a second time period of the input signal;
  wherein the supply means are configured to, during the first portion of a third time period of the input signal, supply a low voltage to the first input of the integrator circuit and supply a high voltage to the second input of the integrator circuit, and wherein the supply means are further configured to, during the second portion of the third time period of the input signal, supply a high voltage to the first input of the integrator circuit and supply a low voltage to the second input of the integrator circuit,
  wherein the hold capacitor is configured to hold the voltage difference between the second output of the integrator circuit and the first output of the integrator circuit at the end of the third time period of the input signal, and wherein the voltage held at the hold capacitor is used to provide the voltage output signal and the first output of the integrator circuit is further coupled to the first input via a third capacitor, and the second output of the integrator circuit is further coupled to the second input via a fourth capacitor, the converter further comprising:

means for discharging the third and fourth capacitors during the first and third time periods of the input signal;

wherein the supply means are configured to, during the first portion of the second time period of the input signal, supply a high voltage to the first input of the integrator circuit and supply a low voltage to the second input of the integrator circuit, to charge the third and fourth capacitors to have respectively opposite charge states, and wherein the supply means are configured to, during the second portion of the second time period of the input signal, supply a low voltage to the first input of the integrator circuit and supply a high voltage to the second input of the integrator circuit to thereby charge the third and fourth capacitors with respectively reversed current, wherein the hold capacitor is configured to hold the voltage difference between the voltage at the first output of the integrator circuit and the voltage at the second output of the integrator circuit at the end of the second time period of the input signal, wherein the supply means are configured to, during the first portion of a fourth time period of the input signal, supply a low voltage to the first input of the integrator circuit and supply a high voltage to the second input of the integrator circuit, and wherein the supply means are further configured to, during the second portion of the fourth time period of the input signal, supply a high voltage to the first input of the integrator circuit and supply a low voltage to the second input of the integrator circuit, and wherein the hold capacitor is configured to hold the voltage difference between the voltage at the second output of the integrator circuit and the voltage at the first output of the integrator circuit at the end of the fourth time period of the input signal.

21. The apparatus of claim 18, further comprising a logic circuit configured to generate said clock signal by logically combining said pulse width modulated signal with a reference clock having a period which is an integer multiple of a period of the periodic pulse width modulated signal.

* * * * *